(12) United States Patent  
Tuan et al.

(10) Patent No.: US 7,098,689 B1
(45) Date of Patent: Aug. 29, 2006

(54) DISABLING UNUSED/INACTIVE RESOURCES IN PROGRAMMABLE LOGIC DEVICES FOR STATIC POWER REDUCTION

(75) Inventors: Tim Tuan, San Jose, CA (US); Kameswara K. Rao, San Jose, CA (US); Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 44 days.

(21) Appl. No.: 10/666,669

(22) Filed: Sep. 19, 2003

(51) Int. Cl.
  *H03K 19/094* (2006.01)
  *H03K 19/177* (2006.01)
  *G05F 1/10* (2006.01)
  *G11C 5/14* (2006.01)

(52) U.S. Cl. .................. 326/44; 326/40; 327/544; 365/227

(58) Field of Classification Search .............. 326/33, 326/39, 40, 41, 44, 45; 327/544; 365/227
  See application file for complete search history.

(56) References Cited

U.S. PATENT DOCUMENTS

| | | | | |
|---|---|---|---|---|
| 5,583,457 A | * | 12/1996 | Horiguchi et al. | 326/121 |
| 5,615,162 A | * | 3/1997 | Houston | 365/226 |
| 5,671,149 A | | 9/1997 | Brown | |
| 5,682,107 A | * | 10/1997 | Tavana et al. | 326/41 |
| 5,801,548 A | * | 9/1998 | Lee et al. | 326/44 |
| 5,946,257 A | * | 8/1999 | Keeth | 365/226 |
| 5,958,026 A | * | 9/1999 | Goetting et al. | 710/52 |
| 6,169,419 B1 | * | 1/2001 | De et al. | 326/58 |
| 6,172,518 B1 | | 1/2001 | Jenkins, IV. et al. | |
| 6,208,171 B1 | * | 3/2001 | Kumagai et al. | 326/121 |
| 2003/0218478 A1 | * | 11/2003 | Sani et al. | 326/33 |

OTHER PUBLICATIONS

U. S. Appl. No. 10/606,619, filed Jun. 6, 2003, New et al.

Jae Y. Park, Mark G. Allen; "A Comparison of Micromachined Inductors with Different Magnetic Core Materials"; 1996 Electronic Components and Technology Conference; 1996 IEEE; pp. 375-381.

Thomas D. Burd et al.; "A Dynamic Voltage Scaled Microprocessor System"; 2000 IEEE; IEEE Journal of Solid-State Circuits, vol. 35, No. 11, Nov. 2000; pp. 1571-1580.

(Continued)

*Primary Examiner*—Daniel D. Chang
(74) *Attorney, Agent, or Firm*—E. Eric Hoffman; Justin Liu

(57) ABSTRACT

A method of operating a programmable logic device, including the steps of enabling resources of the programmable logic device being used in a circuit design implemented by the programmable logic device, and disabling unused or inactive resources of the programmable logic device that are not being used in the circuit design. The step of disabling can include de-coupling the unused or inactive resources from one or more power supply terminals. Alternatively, the step of disabling can include regulating a supply voltage applied to the unused or inactive resources. The step of disabling can be performed in response to configuration data bits stored by the programmable logic device and/or in response to user controlled signals. The step of disabling can be initiated during design time and/or run time of the programmable logic device.

9 Claims, 4 Drawing Sheets

OTHER PUBLICATIONS

Anthony J. Stratakos et al.; "A Low-Voltage CMOS DC-DC Converter for a Portable Battery-Operated System"; 1994 IEEE; pp. 619-626.

Anthony John Stratakos; "High-Efficiency Low-Voltage DC-DC Conversion for Portable Applications," Chapter 3; "DC-DC Converter Fundamentals"; pp. 42-78, no date.

Jae Y. Park, Mark G. Allen; "A Comparison of Micromachined Inductors with Different Magnetic Core Materials"; 1996 Electronic Components and Technology Conference; 1996 IEEE; pp. 375-381, no month.

Thomas D. Burd et al.; "A Dynamic Voltage Scaled Microprocessor System"; 2000 IEEE; IEEE Journal of Solid-State Circuits, vol. 35, No. 11, Nov. 2000; pp. 1571-1580.

Anthony J. Stratakos et al.; "A Low-Voltage CMOS DC-DC Converter for a Portable Battery-Operated System"; 1994 IEEE; pp. 619-626, no month.

* cited by examiner

DISABLING UNUSED/INACTIVE RESOURCES IN PROGRAMMABLE LOGIC DEVICES FOR STATIC POWER REDUCTION

FIELD OF THE INVENTION

The present invention relates to the disabling of unused and/or inactive blocks in a programmable logic device to achieve lower static power consumption.

RELATED ART

Technology scaling of transistor geometry has resulted in a rapid increase of static power consumption in semiconductor devices. At the current rate of increase, static power consumption will become the dominant source of power consumption in the near future. In many applications, such as those powered by batteries, low static power consumption is a property of great importance, for example, due to the desirability of a long battery life.

Programmable logic devices (PLDS), such as field programmable gate arrays (FPGAs), have a significantly higher static power consumption than dedicated logic devices, such as standard-cell application specific integrated circuits (ASICs). A reason for this high static power consumption is that for any given design, a PLD only uses a subset of the available resources. The unused resources are necessary for providing greater mapping flexibility to the PLD. However, these unused resources still consume static power in the form of leakage current. Consequently, PLDs are generally not used in applications where low static power is required.

It would therefore be desirable to have a PLD having a reduced static power consumption.

SUMMARY

In accordance with one embodiment of the present invention, unused and/or inactive resources in a PLD are disabled to achieve lower static power consumption.

One embodiment of the present invention provides a method of operating a PLD, which includes the steps of enabling the resources of the PLD that are used in a particular circuit design, and disabling the resources of the PLD that are unused or inactive. The step of disabling can include de-coupling the unused or inactive resources from one or more power supply terminals. Alternately, the step of disabling can include regulating (e.g., reducing) a supply voltage applied to the unused or inactive resources.

In accordance with one embodiment, the step of disabling can be performed in response to configuration data bits stored by the PLD. These configuration data bits can be determined during the design of the circuit to be implemented by the PLD. That is, during the design, the design software is able to identify unused resources of the PLD, and select the configuration data bits to disable these unused resources.

The step of disabling can also be performed in response to user-controlled signals. These user-controlled signals can be generated in response to observable operating conditions of the PLD. For example, if certain resources of the operating PLD are inactive for a predetermined time period, then the user-controlled signals may be activated, thereby causing the inactive resources to be disabled.

In accordance with another embodiment, a PLD includes a first voltage supply terminal that receives a first supply voltage, a plurality of programmable logic blocks, and a plurality of switch elements, wherein each switch element is coupled between one of the programmable logic blocks and the first voltage supply terminal. A control circuit coupled to the switch elements provides a plurality of control signals that selectively enable or disable the switch elements. The control circuit can be controlled by a plurality of configuration data values stored by the PLD and/or a plurality of user-controlled signals. In an alternate embodiment, each of the switch elements can be replaced by a switching regulator.

The present invention will be more fully understood in view of the following description and drawings.

DETAILED DESCRIPTION

In accordance with one embodiment of the present invention, unused and inactive resources in a programmable logic device (PLD), such as a field programmable gate array (FPGA), are disabled to achieve lower static power consumption. The present invention includes both an enabling software flow and an enabling hardware architecture, which are described in more detail below. Unused resources of the PLD can be disabled when designing a particular circuit to be implemented by the PLD (hereinafter referred to as "design time"). In addition, resources of the PLD that are temporarily inactive can be disabled during operation of the PLD (hereinafter referred to as "run time").

Figure 1:
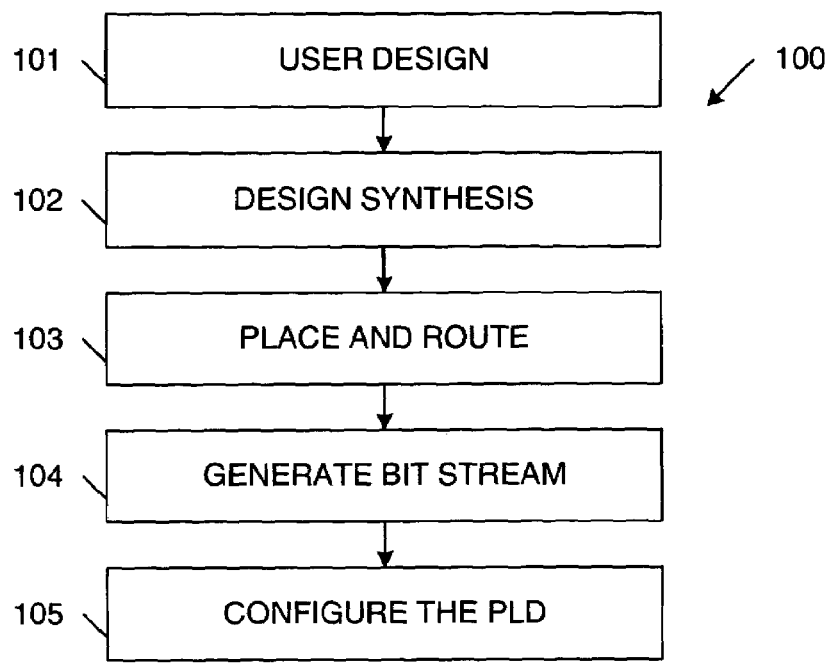
FIG. 1 is a flow diagram illustrating a conventional design flow used for PLDs.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bit stream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

In accordance with the present invention, unused resources of the PLD are identified during the design time, following the place and route process (Step 103). These unused resources are then selectively disabled during the design time. As described below, there are several ways to disable the unused resources. By selectively disabling the unused resources at design time, significant static power reduction may be achieved with no performance penalty.

Figure 2:
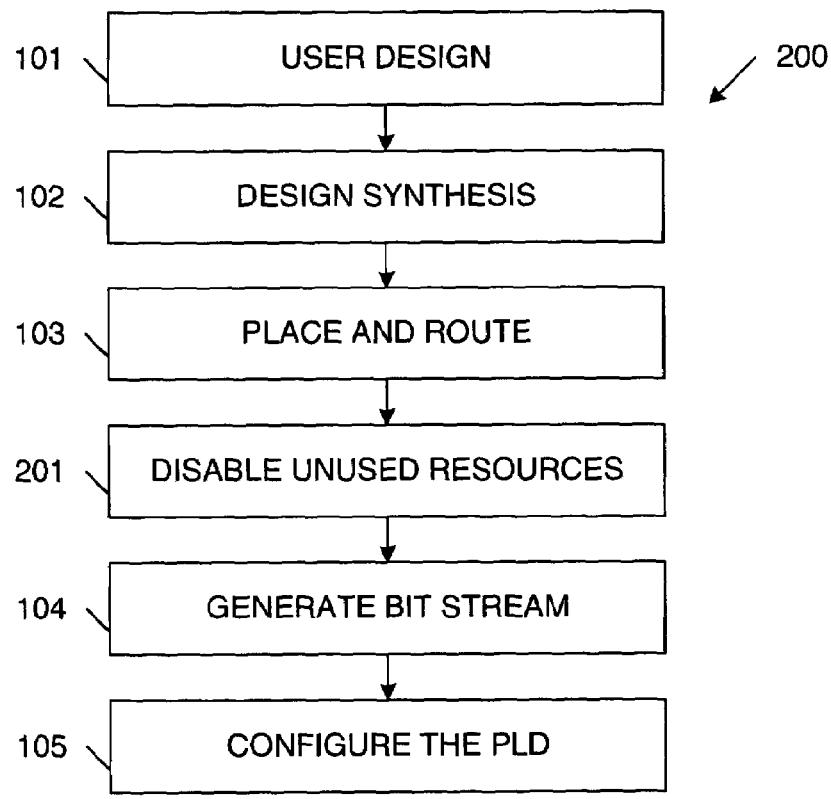
FIG. 2 is a flow diagram illustrating a design flow for a PLD in accordance with one embodiment of the present invention.

FIG. 2 is a flow diagram 200 illustrating a design flow in accordance with one embodiment of the present invention. Similar steps in flow diagrams 100 and 200 are labeled with similar reference numbers. Thus, flow diagram 200 includes Steps 101–105 of flow diagram 100, which are described above. In addition, flow diagram 200 includes the step of disabling unused resources in the PLD (Step 201). This step of disabling unused resources is performed after the place and route process has been completed in Step 103, and before the configuration bit stream is generated in Step 104. As described in more detail below, the unused resources are disabled by disabling predetermined programmable logic blocks of the PLD.

In another embodiment, further power savings are obtained by disabling temporarily inactive resources of the configured PLD during run time. Often, the entire design or parts of the design are temporarily inactive for some period of time. If the inactive period is sufficiently long, it is worthwhile to disable the inactive resources to reduce static power consumption. In a preferred embodiment, the decision of when to disable a temporarily inactive resource is made by the designer. In this embodiment, the user logic is provided access to a disabling mechanism, which enables the inactive resources to be disabled dynamically.

There are a number of techniques to disable resources in a PLD. In accordance with one embodiment, the PLD is logically subdivided into a plurality of separate programmable logic blocks. As described below, each programmable logic block may comprise one or more of the resources available on the programmable logic device. Switch elements are used to couple each of the programmable logic blocks to one or more associated voltage supply terminals (e.g., $V_{DD}$ or ground). The switch elements are controlled to perform a power-gating function, wherein unused and/or inactive programmable logic blocks are disabled (e.g., prevented from receiving power or receiving a reduced power). Preferably; only one of the voltage supply terminals ($V_{DD}$ or ground) is power-gated, thereby reducing the speed and area penalties associated with the switch elements. When the switch elements are controlled to de-couple the associated programmable logic blocks from the associated supply voltage, these programmable logic blocks are effectively disabled, thereby dramatically reducing the static power consumption of these blocks.

Figure 3:
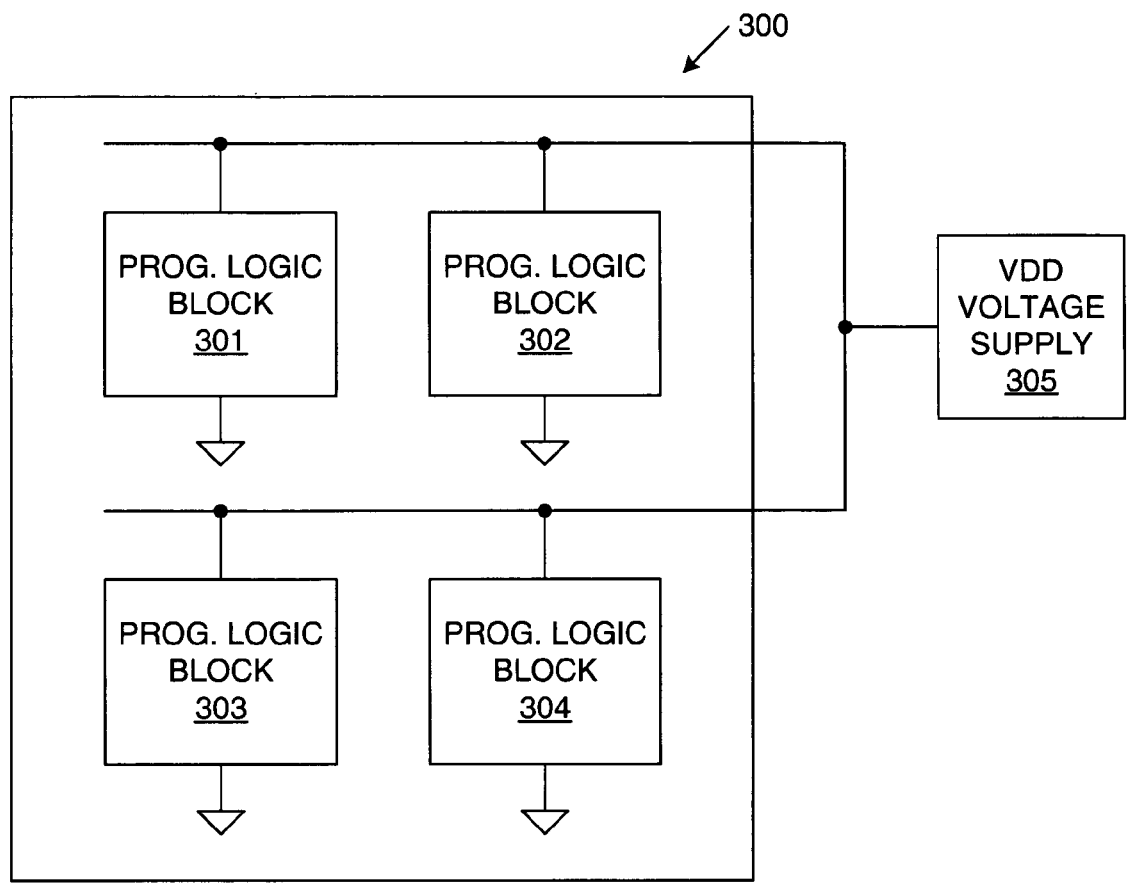
FIG. 3 is a block diagram of a conventional PLD having four blocks, which are all powered by the same off-chip $V_{DD}$ voltage supply.

FIG. 3 is a block diagram of a conventional PLD 300 having four programmable logic blocks 301–304, which are all powered by the same off-chip $V_{DD}$ voltage supply 305. Note that all four programmable logic blocks 301–304 are coupled to receive the $V_{DD}$ supply voltage during normal operating conditions, even if some of these blocks are not used in the circuit design.

Figure 4:
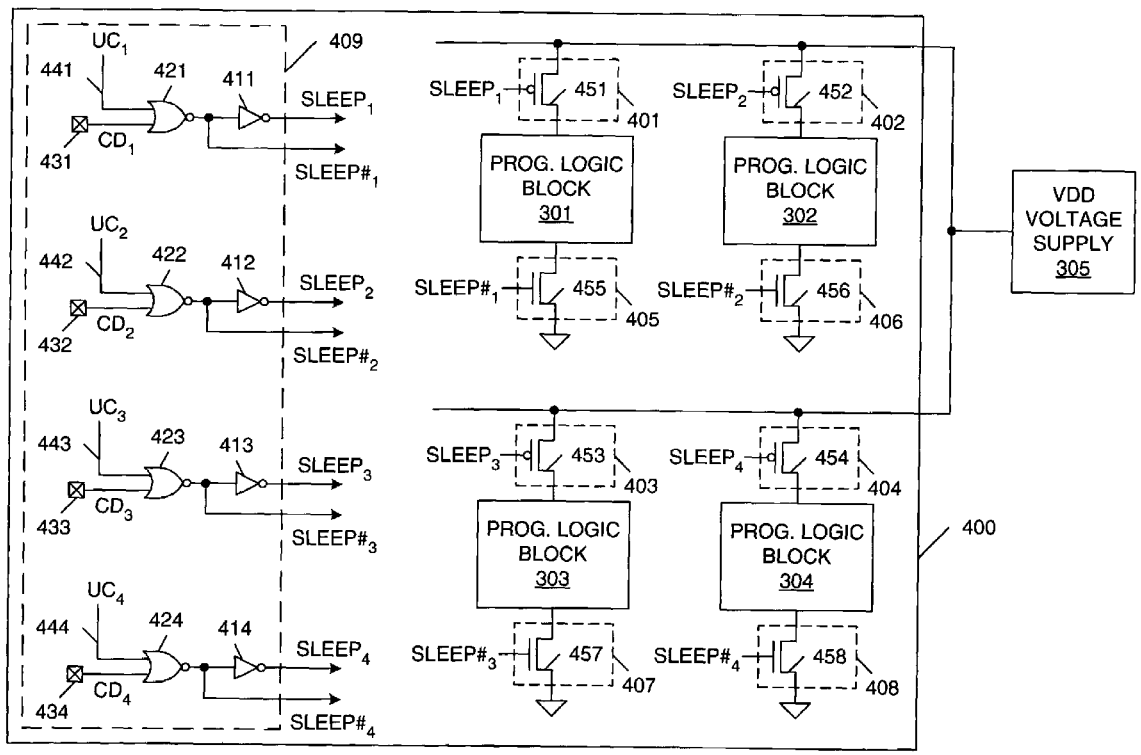
FIG. 4 is a block diagram of a PLD that implements power-gating switch elements in accordance with one embodiment of the present invention.

FIG. 4 is a block diagram of a PLD 400 in accordance with one embodiment of the present invention. Similar elements in FIGS. 3 and 4 are labeled with similar reference numbers. Thus, PLD 400 includes programmable logic blocks 301–304 and $V_{DD}$ voltage supply 305. In addition, PLD 400 includes switch elements 401–408, and control circuit 409. In the described embodiment, switch elements 401–404 are implemented by PMOS power-gating transistors 451–454, respectively, and switch elements 405–408 are implemented by NMOS power-gating transistors 455–458, respectively. In other embodiments, switch elements 401–408 may be any switch known to those ordinarily skilled in the art. Control circuit 409 is implemented by inverters 411–414, NOR gates 421–424, configuration memory cells 431–434, and user logic input terminals 441–444.

NOR gates 421–424 and inverters 411–414 are configured to generate power-gating control signals $SLEEP_1$–$SLEEP_4$ and $SLEEP\#_1$–$SLEEP\#_4$ in response to the configuration data values $CD_1$—$CD_4$ stored in configuration memory cells 431–434, respectively, and the user control signals $UC_1$–$UC_4$ provided on user logic input terminals 441–444, respectively.

For example, NOR gate 421 is coupled to receive configuration data value $CD_1$ from configuration memory cell 431 and user control signal $UC_1$ from user logic input terminal 441. If either the configuration data value $CD_1$ or the user control signal $UC_1$ is activated to a logic high state, then NOR gate 421 provides an output signal ($SLEEP\#_1$) having a logic "0" state. In response, inverter 411, which is coupled to the output terminal of NOR gate 421, provides an output signal ($SLEEP_1$) having a logic "1" state.

The $SLEEP_1$ signal is applied to the gate of PMOS power-gating transistor 451, which is coupled between block 301 and the $V_{DD}$ voltage supply terminal. The $SLEEP\#_1$ signal is applied to the gate of NMOS power-gating transistor 455, which is coupled between block 301 and the ground voltage supply terminal. The logic "0" state of the $SLEEP\#_1$ signal causes NMOS power-gating transistor 455 to turn off, thereby de-coupling block 301 from the ground supply voltage terminal. Similarly, the logic "1" state of the $SLEEP_1$ signal causes PMOS power-gating transistor 451 to turn off, thereby de-coupling block 301 from the $V_{DD}$ supply voltage terminal. De-coupling block 301 from the $V_{DD}$ and ground supply voltage terminals effectively disables block 301, thereby minimizing the static leakage current in this block.

If both the configuration data value $CD_1$ and the user control signal $UC_1$ are de-activated to a logic low state, then NOR gate 421 provides a $SLEEP\#_1$ signal having a logic "1" state, and inverter 411 provides a $SLEEP_1$ signal having a logic "0" state. The logic "1" state of the $SLEEP\#_1$ signal causes NMOS power-gating transistor 455 to turn on, thereby coupling block 301 to the ground supply voltage terminal. Similarly, the logic "0" state of the $SLEEP_1$ signal causes PMOS power-gating transistor 451 to turn on, thereby coupling block 301 to the $V_{DD}$ supply voltage terminal. Coupling block 301 to the $V_{DD}$ and ground supply voltage terminals effectively enables block 301.

Programmable logic block 302 may be enabled and disabled in response to configuration data value $CD_2$ and user control signal $UC_2$, in the same manner as block 301. Similarly, programmable logic block 303 may be enabled and disabled in response to configuration data value $CD_3$ and user control signal $UC_3$, in the same manner as block 301. Programmable logic block 304 may be enabled and disabled in response to configuration data value $CD_4$ and user control signal $UC_4$, in the same manner as block 301.

As described above, when a programmable logic block is used and active, the associated power-gating transistors are turned on. Conversely, when a programmable logic block is unused or inactive, the associated power gating transistors are turned off. The $SLEEP_1$—$SLEEP_4$ and $SLEEP\#_1$–$SLEEP\#_4$ signals can be controlled by the configuration data values $CD_1$–$CD_4$ stored by configuration memory cells 431–434, which are best suited for disabling the associated blocks at design time. If a block is not disabled at design time, this block can be disabled at run time by the user control signals $UC_1$–$UC_4$, which may be generated by the user logic, or by other means.

In accordance with another embodiment of the present invention, some blocks have multiple supply voltages. In this case all of the supply rails should be power-gated to achieve maximum power reduction. In accordance with another embodiment, only one switch element may be associated with each block. That is, the blocks are power-gated by de-coupling the block from only one power supply terminal, and not both the $V_{DD}$ and ground supply voltage terminals, thereby conserving layout area.

The granularity of the power-gated programmable logic blocks can range from arbitrarily small circuits to significant portions of the PLD. The decision concerning the size of each programmable logic block is made by determining the desired trade-off between power savings, layout area overhead of the switch elements and the control circuit, and speed penalty. In a FPGA, each programmable logic block may be selected to include one or more configuration logic blocks (CLBs), input/output blocks (IOBs), and/or other resources of the FPGA (such as block RAM, processors, multipliers, adders, transceivers).

Another way to disable a programmable logic block is by scaling down the local supply voltage to the block as low as possible, which dramatically reduces the static power consumption of the block. To scale down the local supply voltage in this manner, each independently controlled programmable logic block is powered by a separate switching regulator.

Figure 5:
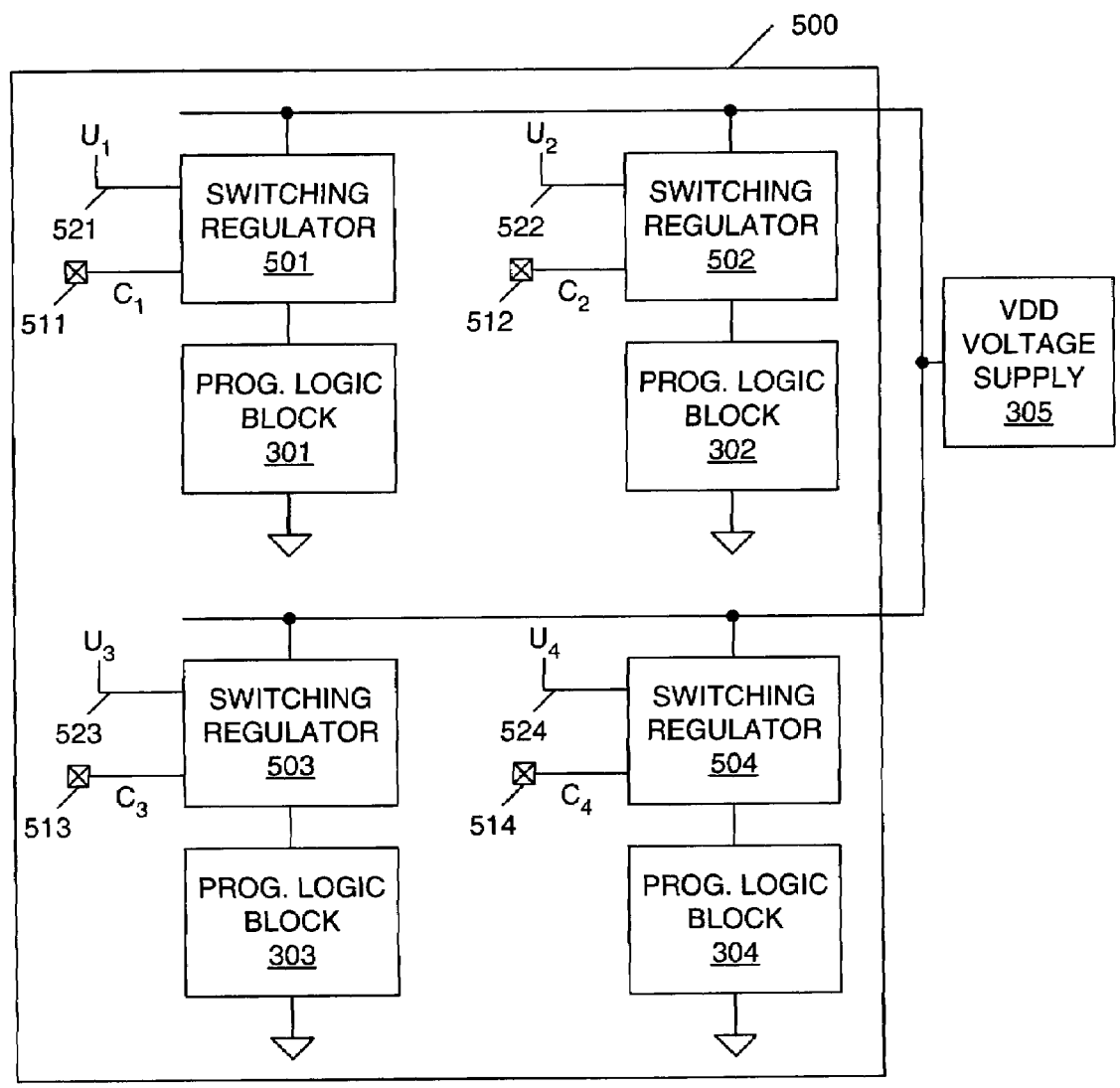
FIG. 5 is a block diagram of a PLD that implements switching regulators in accordance with one embodiment of the present invention.

FIG. 5 is a block diagram of a PLD 500 that implements switching regulators in accordance with one embodiment of the present invention. Similar elements in FIGS. 3 and 5 are labeled with similar reference numbers. Thus, PLD 500 includes programmable logic blocks 301–304 and $V_{DD}$ voltage supply 305. In addition, PLD 500 includes switching regulators 501–504, which are coupled between blocks 301–304, respectively, and $V_{DD}$ voltage supply 305. Switching regulators 501–504 are controlled by control circuits 511–514, respectively. In the described embodiment, switching regulators 501–504 reside on the same chip as blocks 301–304. However, in other embodiments, these switching regulators can be located external to the chip containing blocks 301–304. Switching regulators 501–504 can be programmably tuned to provide the desired supply voltages to the associated programmable logic blocks 301–304. For example, switching regulator 501 can provide a full $V_{DD}$ supply voltage to programmable logic block 301 when this block is used and active. However, switching regulator 501 can further be controlled to provide a reduced voltage (e.g., some percentage of the $V_{DD}$ supply voltage) to programmable logic block 301 when this block is unused or inactive. This reduced voltage may be predetermined (by design or via testing) depending on the desired circuit behavior. For example, this reduced voltage may be the minimum voltage required to maintain the state of the associated blocks. The static power consumption of block 301 is significantly reduced when the supplied voltage is reduced in this manner.

Switching regulators 501–504 are controlled in response to the configuration data values $C_1$–$C_4$ stored in configuration memory cells 511–514, respectively, and the user control signals $U_1$–$U_4$ provided on user control terminals 521–524, respectively. A configuration data value (e.g., $C_1$) having an activated state will cause the associated switching regulator (e.g., switching regulator 501) to provide a reduced voltage to the associated programmable logic block (e.g., block 301). Similarly, a user control signal (e.g., $U_2$) having an activated state will cause the associated switching regulator (e.g., switching regulator 502) to provide a reduced voltage to the associated programmable logic block (e.g., block 502). A configuration data value (e.g., $C_3$) and an associated user control signal (e.g., $U_3$) both having deactivated states will cause the associated switching regulator (e.g., switching regulator 503) to provide the full $V_{DD}$ supply voltage to the associated programmable logic block (e.g., block 503).

In accordance with one embodiment, configuration data values $C_1$–$C_4$ may be selected at design time, such that reduced voltages are subsequently applied to unused blocks during run time. User control signals $U_1$–$U_4$ may be selected during run time, such that reduced voltages are dynamically applied to inactive blocks at run time. Techniques for distributing multiple programmable down-converted voltages using on-chip switching voltage regulators are described in more detail in U.S. patent application Ser. No. 10/606,619, "Integrated Circuit with High-Voltage, Low-Current Power Supply Distribution and Methods of Using the Same" by Bernard J. New, et al., which is hereby incorporated by reference.

In the embodiment of FIG. 5, the granularity of the voltage scaled programmable logic blocks 301–304 should be fairly large because the overhead associated with switching regulators 501–504 is significant. In an FPGA, each programmable logic block 301–304 would most likely be divided into several clusters of configuration logic blocks (CLBs). The exact size of each programmable logic block may be determined by the desired trade-off among power savings, layout area overhead of the switching regulators, and the speed penalty.

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

We claim:

1. A programmable logic device comprising:
   a plurality of resources logically subdivided into a plurality of programmable logic blocks;
   a first voltage supply terminal configured to receive a first supply voltage;
   a plurality of first switch elements, wherein each first switch element is coupled between one of the programmable logic blocks and the first voltage supply terminal; and
   a control circuit coupled to the plurality of first switch elements,
   wherein the control circuit is configured to provide a plurality of control signals for controlling the plurality of first switch elements,
   wherein the control circuit comprises a plurality of configuration memory cells configured to store a corresponding plurality of configuration data values, wherein the control circuit provides the plurality of control signals in response to the plurality of configuration data values, and
   wherein the plurality of configuration data values identify unused programmable logic blocks determined at design time.

2. The programmable logic device of claim 1, further comprising:
   a second voltage supply terminal configured to receive a second supply voltage; and
   a plurality of second switch elements, wherein each second switch element is coupled between one of the programmable logic blocks and the second voltage supply terminal.

3. The programmable logic device of claim 1, wherein the control circuit further comprises a plurality of user control terminals configured to receive a corresponding plurality of user control signals, wherein the control circuit further provides the plurality of control signals in response to the plurality of user control signals.

4. The programmable logic device of claim 3, wherein the plurality of user control signals identify inactive programmable logic blocks.

5. The programmable logic device of claim 4, wherein the inactive programmable logic blocks are determined at run time.

6. The programmable logic device of claim 1, wherein each first switch element comprises a transistor.

7. The programmable logic device of claim 1, wherein the plurality of configuration data values stored in the plurality of configuration memory cells is part of a configuration bit stream provided for configuring the programmable logic device.

8. A programmable logic device comprising:
   a first voltage supply terminal configured to receive a first supply voltage;
   a plurality of programmable logic blocks, each programmable logic block comprising one or more resources of the programmable logic device; and
   a plurality of voltage regulators, wherein each voltage regulator is coupled between one of the programmable logic blocks and the first voltage supply terminal; and
   a control circuit coupled to each of the voltage regulators, wherein the control circuit is configured to provide a plurality of control signals for controlling the plurality of voltage regulators,
   wherein the control circuit comprises a plurality of configuration memory cells configured to store a corresponding plurality of configuration data values, wherein the control circuit provides the plurality of control signals in response to the plurality of configuration data values, and
   wherein the plurality of configuration data values identify unused programmable logic blocks determined at design time.

9. The programmable logic device of claim 8, wherein the control circuit further comprises a plurality of user control terminals configured to receive a corresponding plurality of user control signals, wherein the control circuit further provides the plurality of control signals in response to the plurality of user control signals.

* * * * *